(12) United States Patent
Joei

(10) Patent No.: US 10,978,514 B2
(45) Date of Patent: Apr. 13, 2021

(54) SOLID-STATE IMAGING DEVICE, AND METHOD OF MANUFACTURING SOLID-STATE IMAGING DEVICE

(71) Applicant: SONY SEMICONDUCTOR SOLUTIONS CORPORATION, Kanagawa (JP)

(72) Inventor: Masahiro Joei, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/763,218

(22) PCT Filed: Aug. 18, 2016

(86) PCT No.: PCT/JP2016/074075
§ 371 (c)(1),
(2) Date: Mar. 26, 2018

(87) PCT Pub. No.: WO2017/061176
PCT Pub. Date: Apr. 13, 2017

(65) Prior Publication Data
US 2018/0277604 A1  Sep. 27, 2018

(30) Foreign Application Priority Data

Oct. 6, 2015   (JP) .................. 2015-198578

(51) Int. Cl.
*H01L 27/30* (2006.01)
*H01L 27/146* (2006.01)
(Continued)

(52) U.S. Cl.
CPC .......... *H01L 27/307* (2013.01); *H01L 27/146* (2013.01); *H01L 27/14645* (2013.01);
(Continued)

(58) Field of Classification Search
CPC ............. H01L 27/146; H01L 27/14645; H01L 27/14667; H01L 27/281; H01L 27/286;
(Continued)

(56) References Cited

U.S. PATENT DOCUMENTS 9,281,486 B2 *  3/2016  Takimoto ............. H01L 51/448
2010/0213559 A1 *  8/2010  Mizuno ............ H01L 27/14627
257/432
(Continued)

FOREIGN PATENT DOCUMENTS

CN    101814520 A    8/2010
CN    104885221 A    9/2015
(Continued)

OTHER PUBLICATIONS

International Search Report and Written Opinion of PCT Application No. PCT/JP2016/074075, dated Nov. 15, 2016, 11 pages.

*Primary Examiner* — Mohammed Shamsuzzaman
(74) *Attorney, Agent, or Firm* — Chip Law Group

(57) ABSTRACT

A solid-state imaging device includes: a plurality of pixels each including a first electrode, an organic photoelectric conversion film, and a second electrode in this order on a substrate, the organic photoelectric conversion film including a first inclined surface on a side wall; and a first sealing film formed, on the plurality of pixels, to cover the side wall of the organic photoelectric conversion film and the second electrode.

5 Claims, 12 Drawing Sheets

(51) Int. Cl.
*H04N 5/369* (2011.01)
*H01L 27/28* (2006.01)
*H01L 51/42* (2006.01)
*H01L 51/44* (2006.01)
*H04N 9/04* (2006.01)
*H01L 51/00* (2006.01)

(52) U.S. Cl.
CPC ...... *H01L 27/14667* (2013.01); *H01L 27/281* (2013.01); *H01L 27/286* (2013.01); *H01L 51/4273* (2013.01); *H01L 51/442* (2013.01); *H04N 5/369* (2013.01); *H01L 51/0072* (2013.01); *H01L 51/4293* (2013.01); *H01L 51/448* (2013.01); *H04N 9/045* (2013.01); *Y02E 10/549* (2013.01); *Y02P 70/50* (2015.11)

(58) Field of Classification Search
CPC ............... H01L 27/307; H01L 51/0072; H01L 51/4273; H01L 51/4293; H01L 51/442; H01L 51/448; H04N 9/045; Y02E 10/549; Y02P 70/521
See application file for complete search history.

(56) References Cited

U.S. PATENT DOCUMENTS

| | | | | |
|---|---|---|---|---|
| 2011/0032376 | A1* | 2/2011 | Takizawa | H01L 27/14627 348/222.1 |
| 2013/0015435 | A1* | 1/2013 | Sawaki | H01L 51/4253 257/40 |
| 2013/0015547 | A1* | 1/2013 | Hamano | H01L 27/307 257/436 |
| 2013/0020667 | A1* | 1/2013 | Nakazawa | H01L 27/14636 257/432 |
| 2014/0042416 | A1* | 2/2014 | Imai | H01L 27/307 257/40 |
| 2015/0002719 | A1* | 1/2015 | Isono | H01L 27/14683 348/311 |
| 2015/0303245 | A1* | 10/2015 | Kashiwabara | H01L 27/32 257/40 |
| 2015/0311259 | A1* | 10/2015 | Joei | H01L 27/14636 250/208.1 |
| 2016/0087017 | A1* | 3/2016 | Park | H01L 27/3258 257/40 |
| 2016/0293859 | A1 | 10/2016 | Takemura | |

FOREIGN PATENT DOCUMENTS

| | | |
|---|---|---|
| CN | 105308749 A | 2/2016 |
| CN | 105684149 A | 6/2016 |
| EP | 2939268 A1 | 11/2015 |
| JP | 2002-208725 A | 7/2002 |
| JP | 2009-212106 A | 9/2009 |
| JP | 2010-199258 A | 9/2010 |
| JP | 2014-067768 A | 4/2014 |
| JP | 2014-127545 A | 7/2014 |
| JP | 2015-015332 A | 1/2015 |
| JP | 2015-103735 A | 6/2015 |
| KR | 10-2015-0099730 A | 9/2015 |
| KR | 10-2016-0030102 A | 3/2016 |
| KR | 10-2016-0090807 A | 8/2016 |
| TW | 201521252 A | 6/2015 |
| WO | 2014/103240 A1 | 7/2014 |
| WO | 2015/001771 A1 | 1/2015 |
| WO | 2015/079660 A1 | 6/2015 |

\* cited by examiner

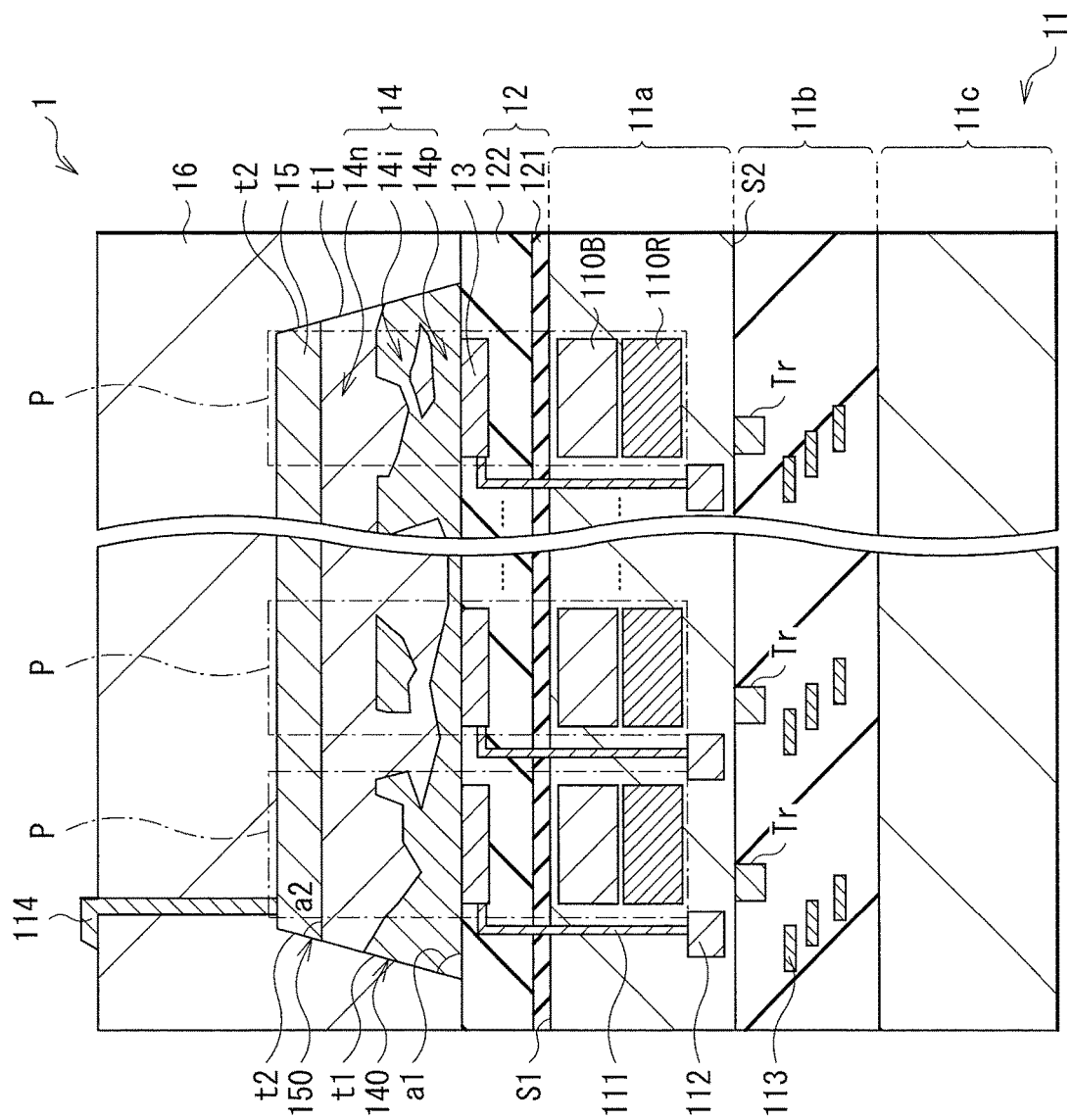
[FIG. 1]

[ FIG. 2 ]
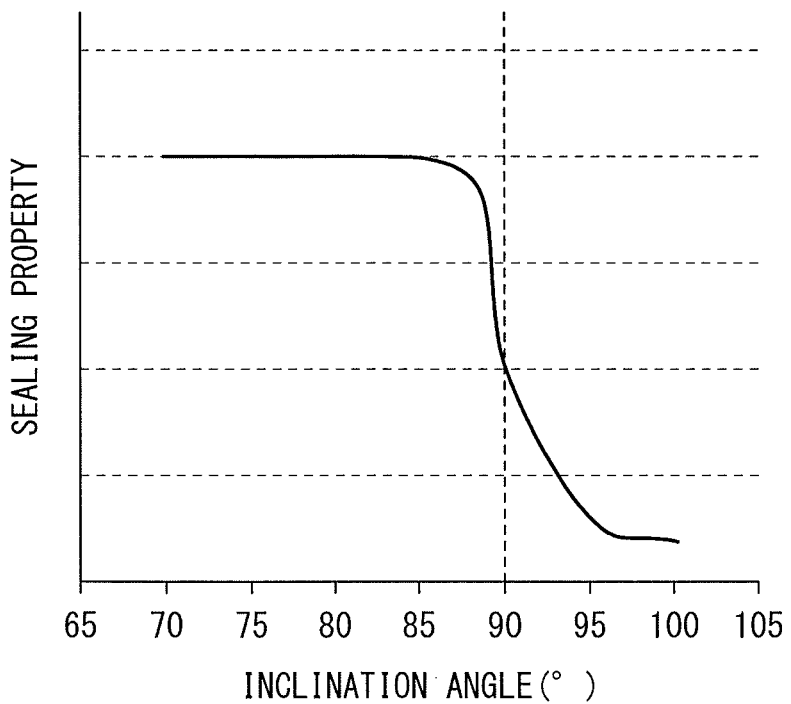
[ FIG. 3 ]
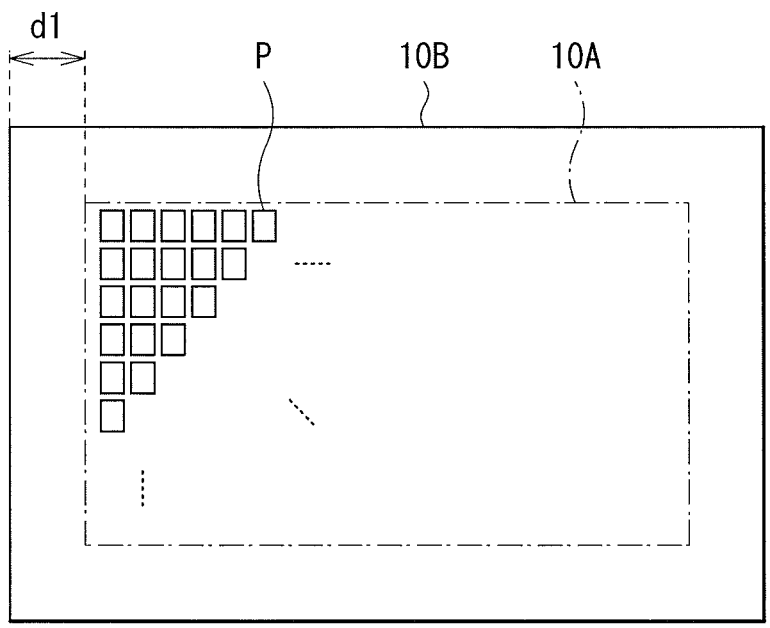

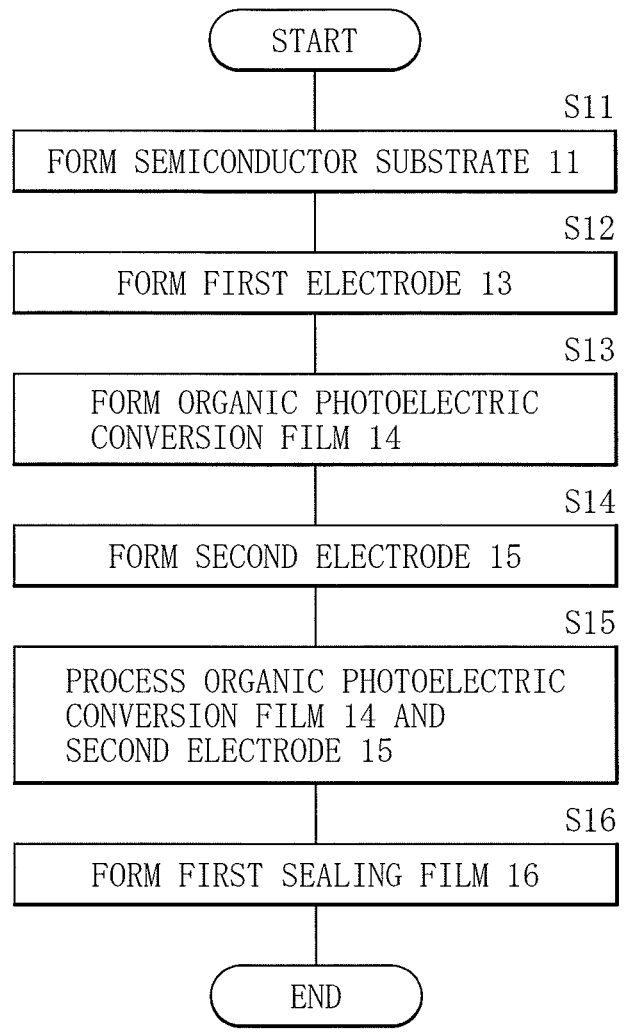
[ FIG. 4 ]

[ FIG. 5 ]
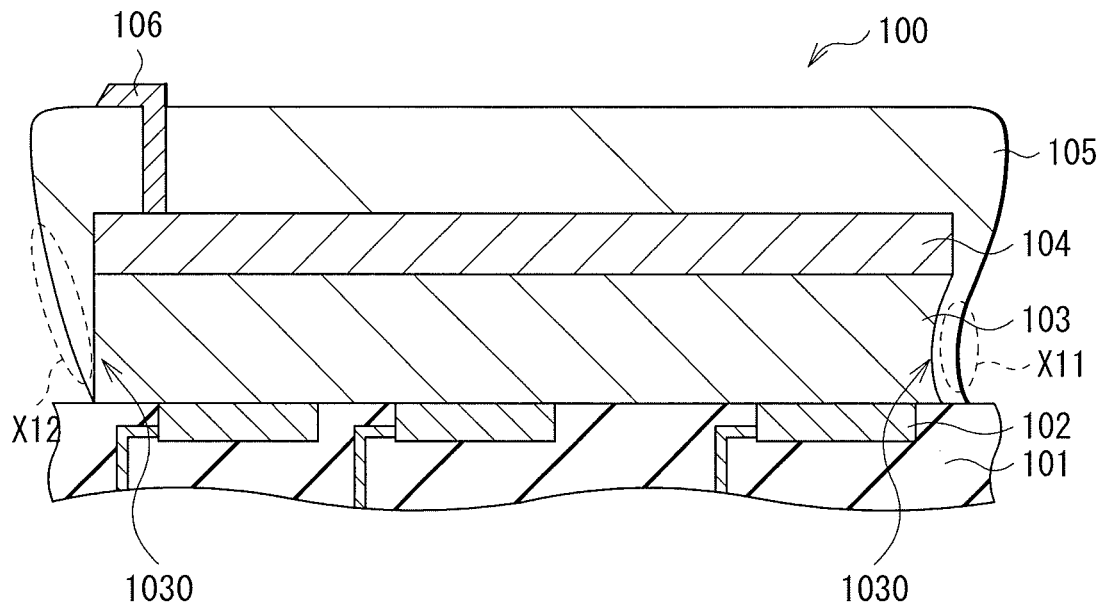
[ FIG. 6A ]
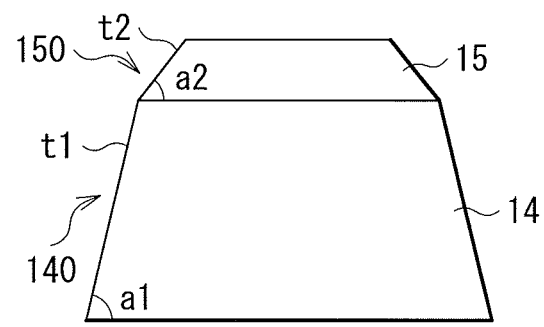
[ FIG. 6B ]
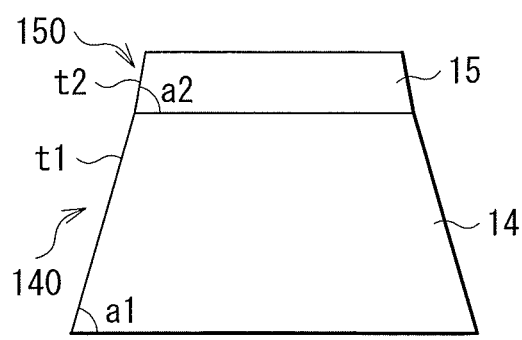

[ FIG. 7 ]
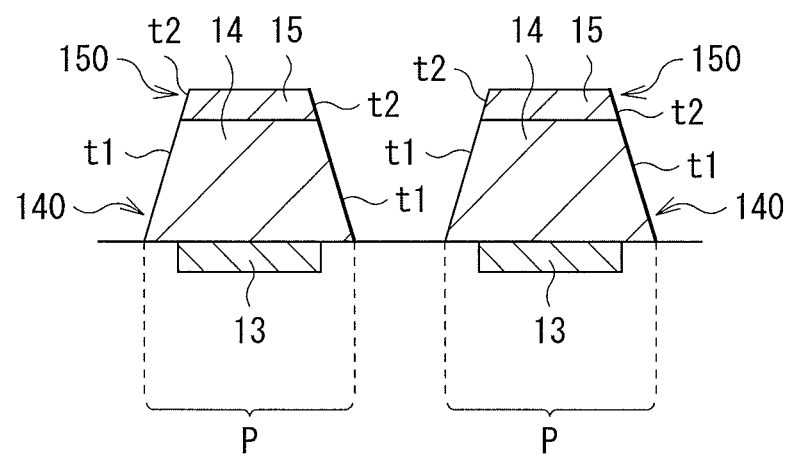

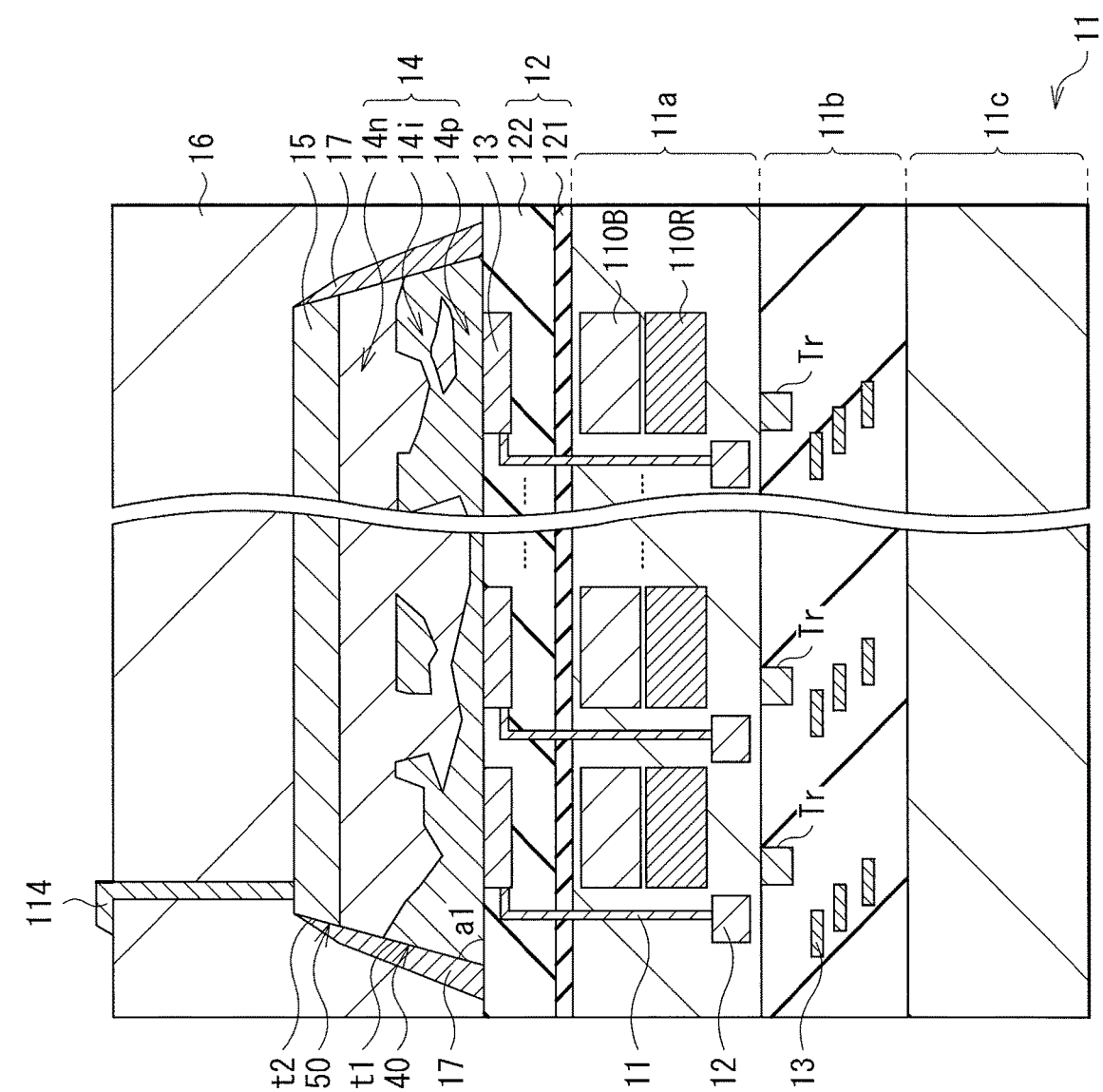
[FIG. 8]

[ FIG. 9A ]
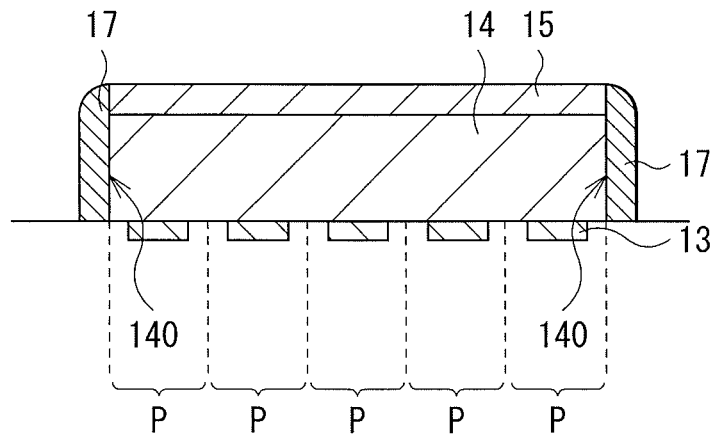
[ FIG. 9B ]
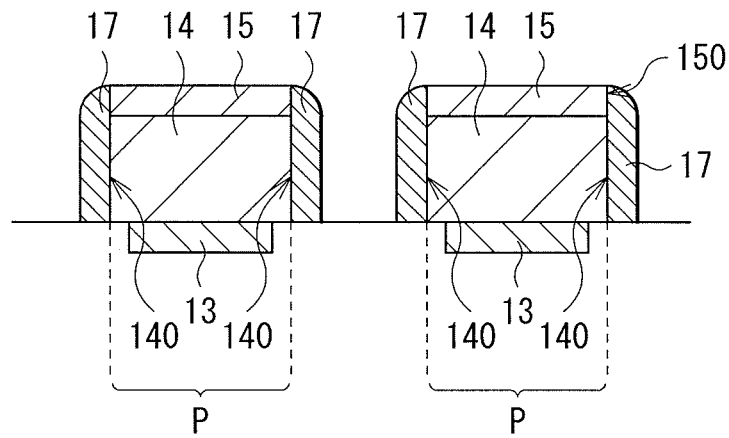
[ FIG. 9C ]
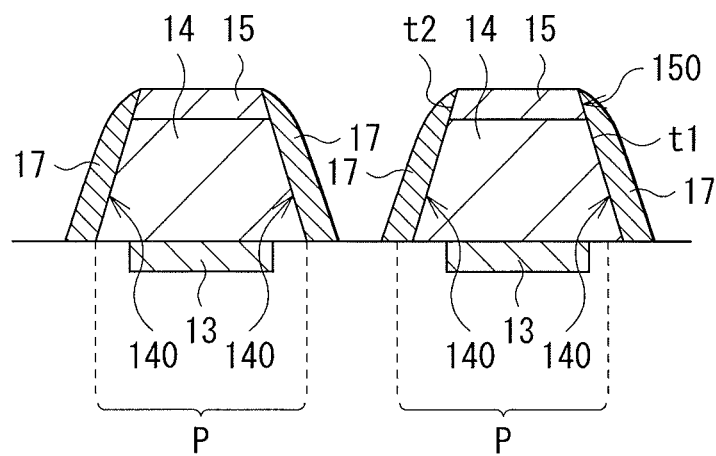

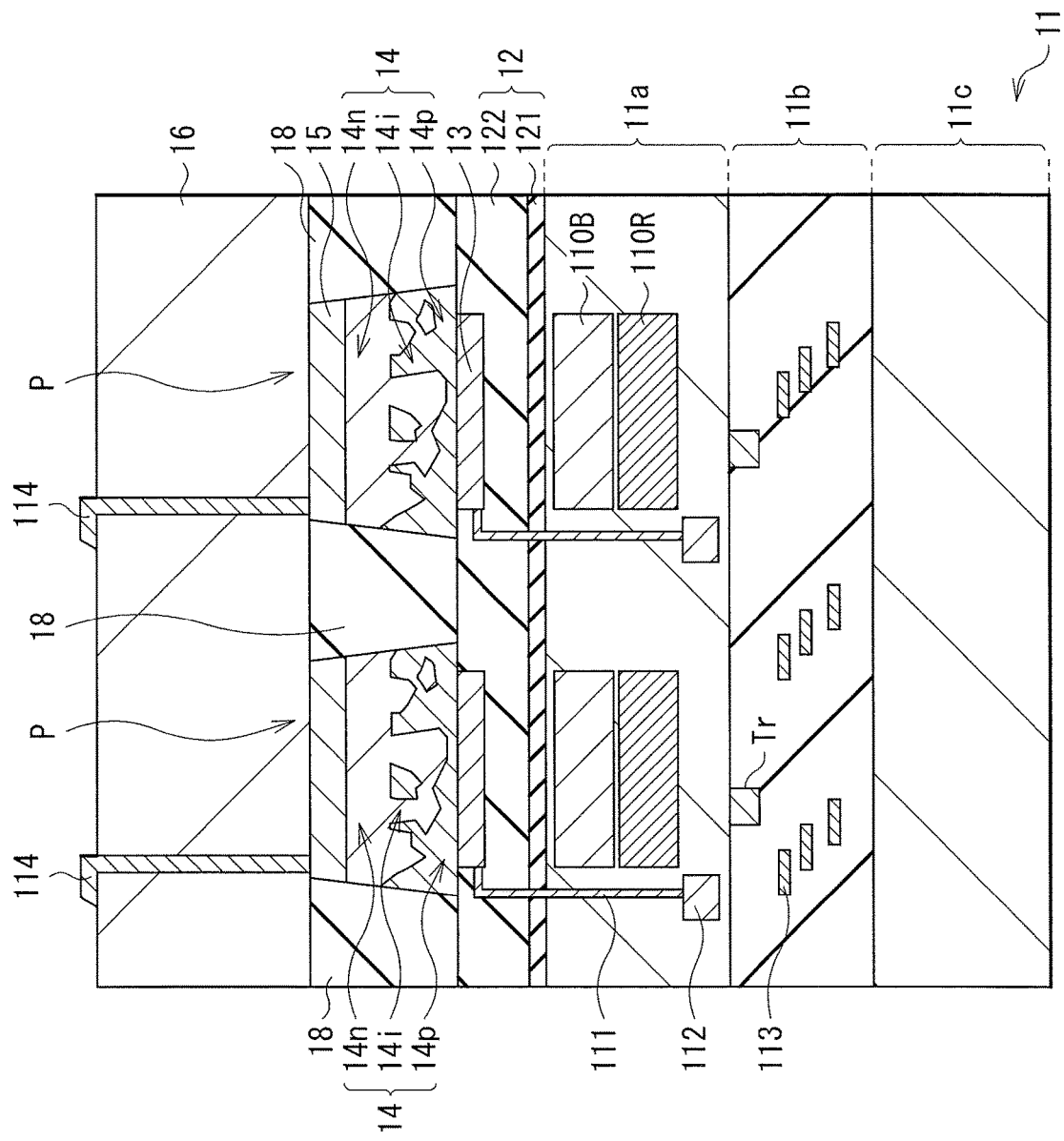
[FIG. 10]

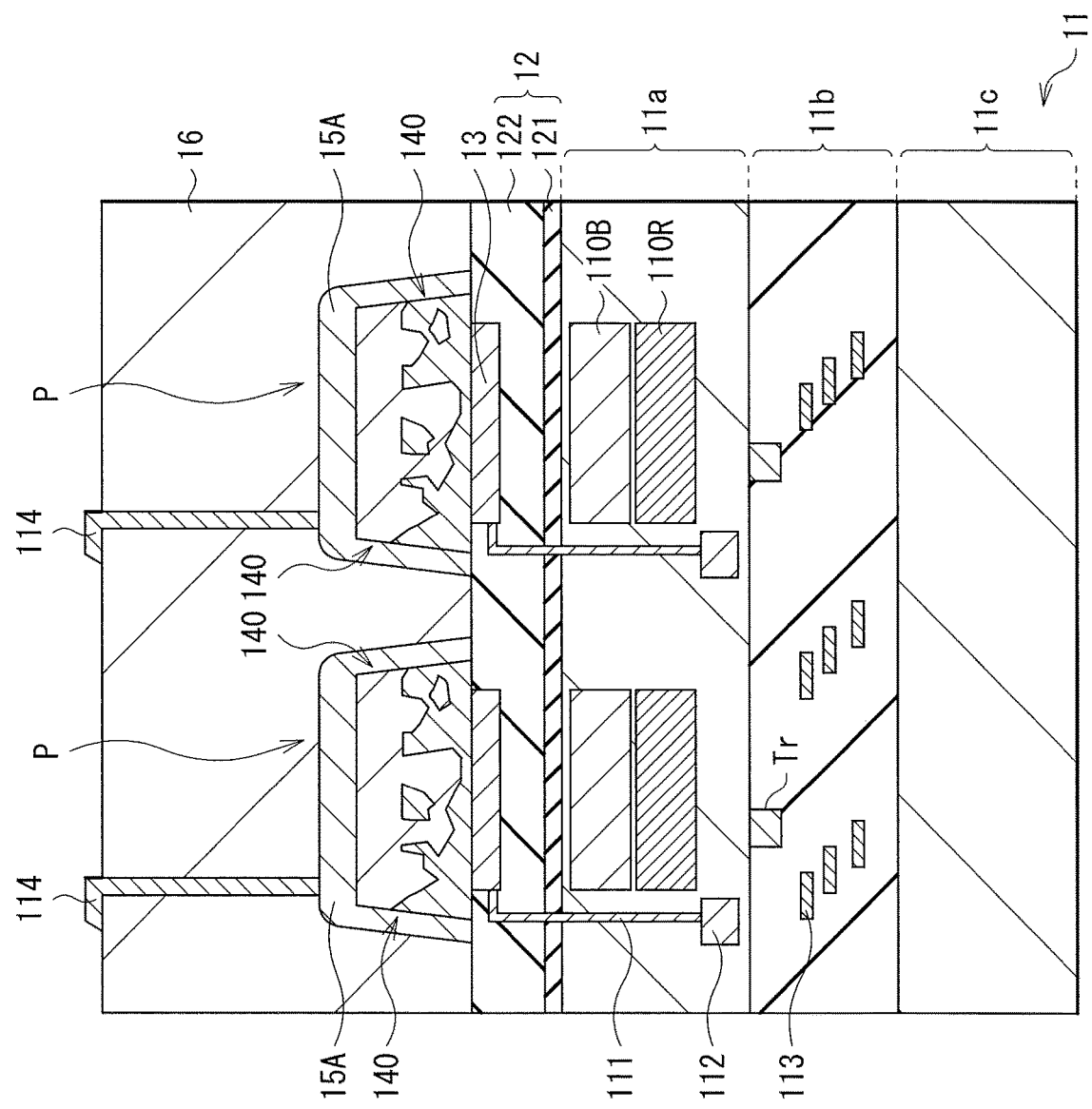
[FIG. 11]

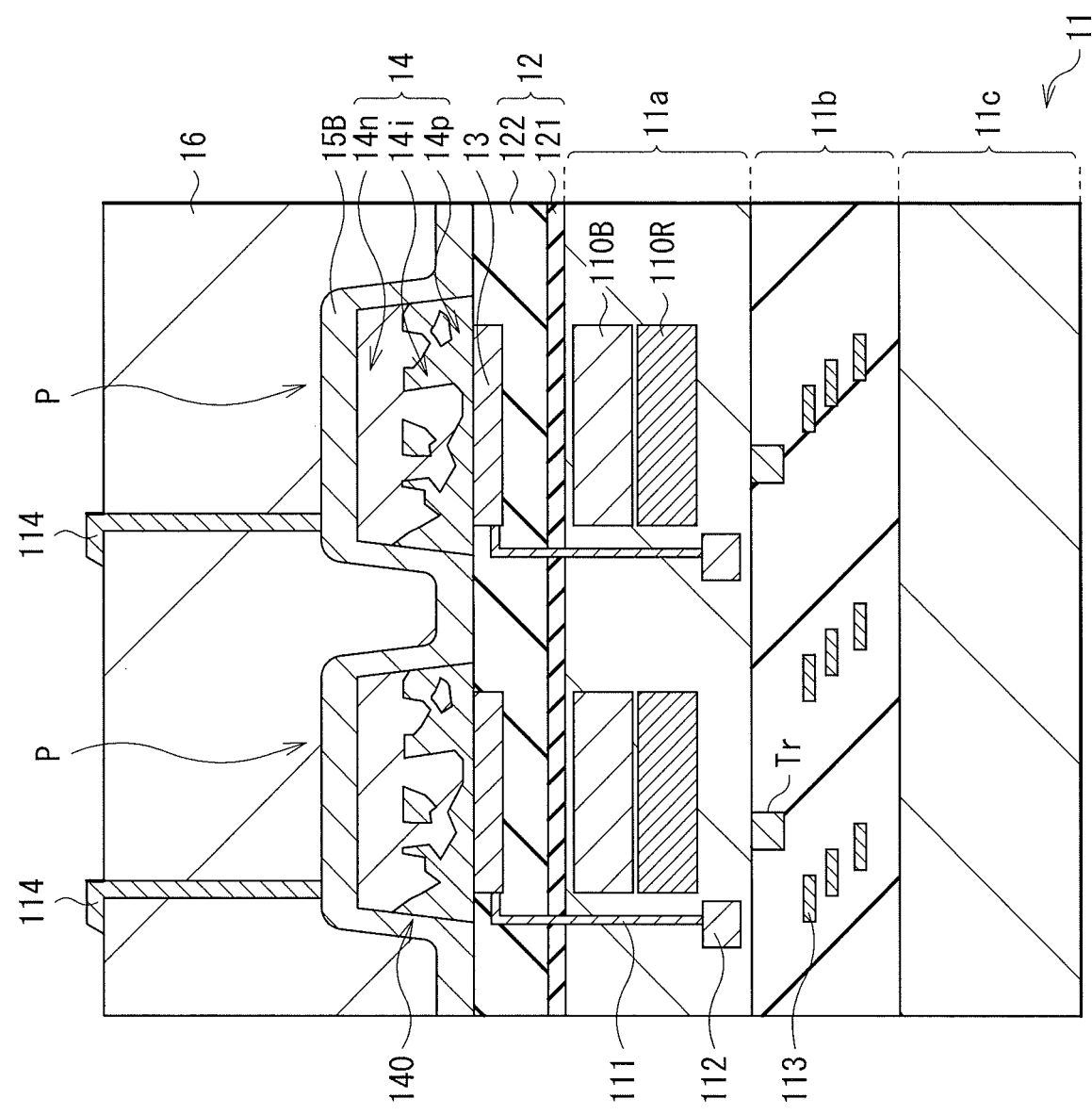
[FIG. 12]

[ FIG. 13 ]
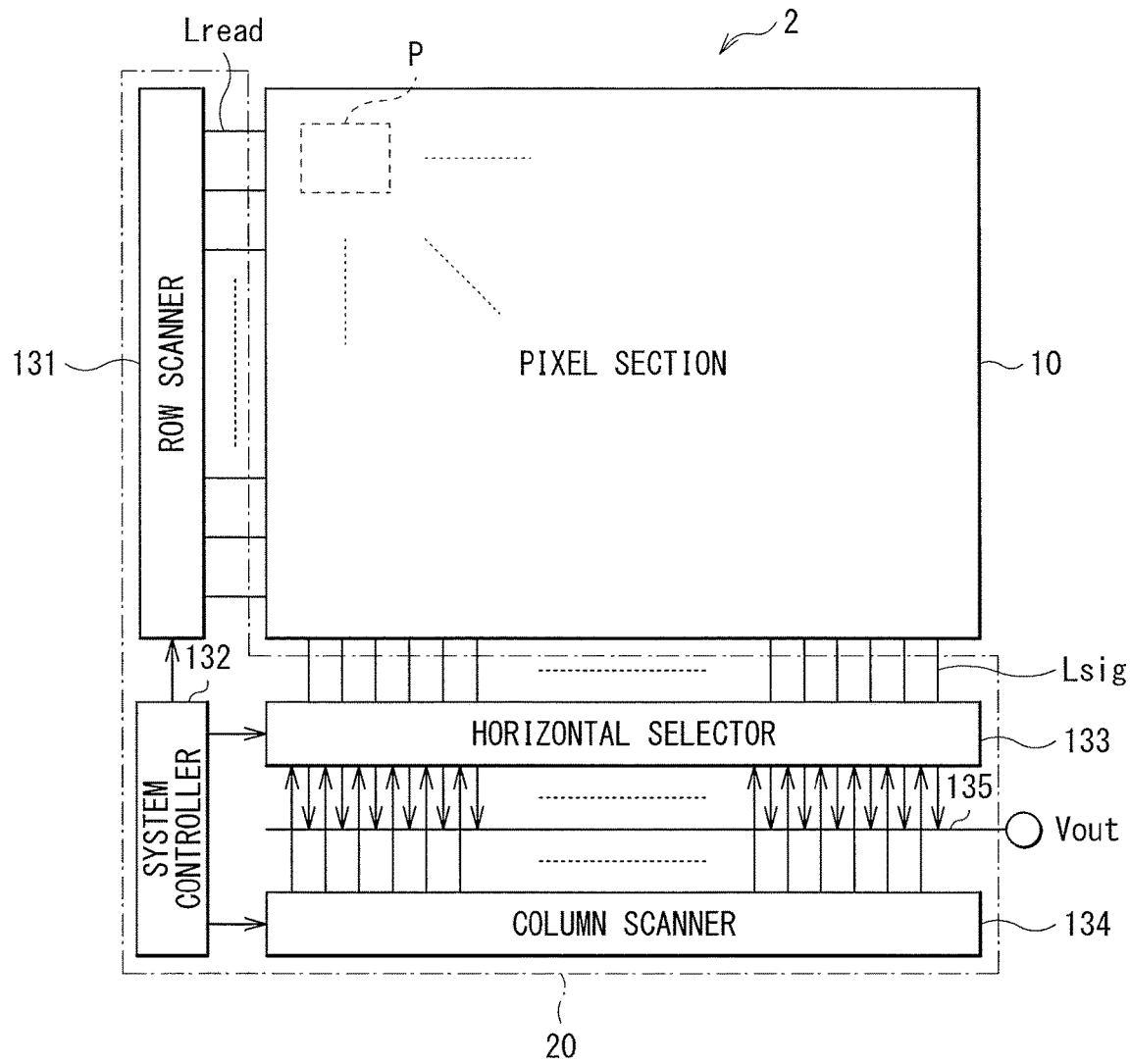
[ FIG. 14 ]
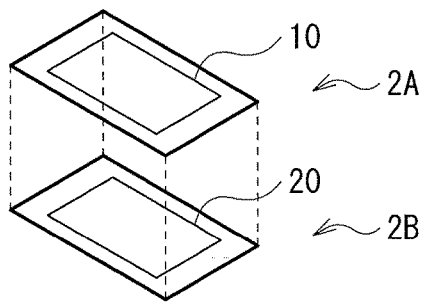

[ FIG. 15 ]
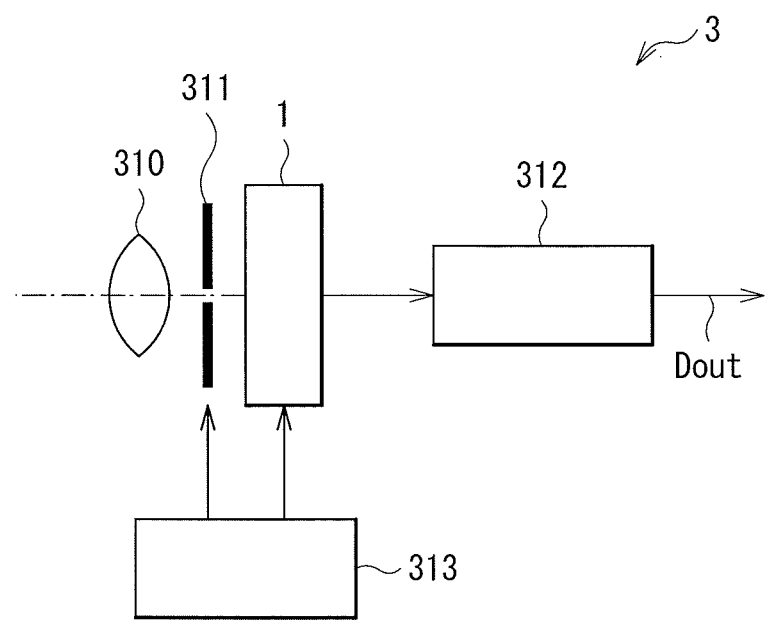

SOLID-STATE IMAGING DEVICE, AND METHOD OF MANUFACTURING SOLID-STATE IMAGING DEVICE

CROSS REFERENCE TO RELATED APPLICATIONS

This application is a U.S. National Phase of International Patent Application No. PCT/JP2016/074075 filed on Aug. 18, 2016, which claims priority benefit of Japanese Patent Application No. JP 2015-198578 filed in the Japan Patent Office on Oct. 6, 2015. Each of the above-referenced applications is hereby incorporated herein by reference in its entirety.

TECHNICAL FIELD

The present disclosure relates to a solid-state imaging device such as a CCD (Charge Coupled Device) image sensor and a CMOS (Complementary Metal Oxide Semiconductor) image sensor, and to a method of manufacturing the solid-state imaging device.

BACKGROUND ART

In recent years, in a solid-state imaging device such as a CCD image sensor and a CMOS image sensor, the number of photons entering a unit pixel is decreased with reduction of a pixel size, which deteriorates sensitivity and an S/N ratio as a result. Further, in such a solid-state imaging device, pixels of three primary colors are often two-dimensionally arranged typically with use of color filters of primary colors of red, green, blue, or other colors. In a case where the color filters are used, however, optical loss occurs to deteriorate sensitivity. For example, in a red pixel, green light and blue light are not photoelectrically converted because the green light and the blue light do not pass through the color filters, which causes optical loss as a result. Moreover, signals of respective colors are generated by interpolation processing between pixels, which generates so-called false colors.

Accordingly, a solid-state imaging device in which three photoelectric conversion layers of red, green, and blue are stacked in a vertical direction and photoelectric conversion signals of three colors are obtainable from one pixel has been proposed (e.g., PTLs 1 and 2). PTL 1 proposes a structure in which an organic photoelectric conversion film that absorbs green light to generate signal charges is provided above a silicon substrate, and two inorganic photoelectric converters (photodiodes) that detect blue light and red light are stacked in the silicon substrate. In addition, PTL 2 proposes a so-called back-illuminated device structure in which a light receiving surface is provided on side opposite to a circuit formation surface of the silicon substrate in such a structure in which the organic photoelectric conversion film respectively provided above the silicon substrate and the silicon substrate.

In the above-described solid-state imaging device including the organic photoelectric conversion film, it is desirable to form a sealing film in order to prevent moisture, etc. from entering the pixel (e.g., PTL 3).

CITATION LIST

Patent Literature

PTL 1: Japanese Unexamined Patent Application Publication No. 2003-332551

PTL 2: Japanese Unexamined Patent Application Publication No. 2011-29337

PTL 3: Japanese Unexamined Patent Application Publication No. 2015-56554

SUMMARY OF INVENTION

In the method disclosed in PTL 3 described above, however, it is not possible to sufficiently secure coverage of the sealing film, and moisture, etc. infiltrates into the organic photoelectric conversion film to deteriorate photoelectric conversion characteristics.

It is desirable to provide a solid-state imaging device that makes it possible to secure sealing performance to suppress deterioration of photoelectric conversion characteristics and a method of manufacturing the solid-state imaging device.

A first solid-state imaging device according to an embodiment of the present disclosure includes: a plurality of pixels each including a first electrode, an organic photoelectric conversion film, and a second electrode in this order on a substrate, the organic photoelectric conversion film including a first inclined surface on a side wall; and a first sealing film formed, on the plurality of pixels, to cover the side wall of the organic photoelectric conversion film and the second electrode.

A method of manufacturing a solid-state imaging device according to an embodiment of the present disclosure includes: a process of forming a plurality of pixels each including a first electrode, an organic photoelectric conversion film, and a second electrode in this order on a substrate, the organic photoelectric conversion film including a first inclined surface on a side wall; and a process of forming a first sealing film, on the plurality of pixels, to cover the side wall of the organic photoelectric conversion film and the second electrode.

In the first solid-state imaging device according to the embodiment of the present disclosure, the organic photoelectric conversion film includes the first inclined surface on the side wall in each of the plurality of pixels. The first sealing film is formed, on the plurality of pixels, to cover the side wall of the organic photoelectric conversion film and the second electrode. In this case, coverage of the first sealing film to the side wall of the organic photoelectric conversion film may become lower due to the film formation process; however, the side wall includes the first inclined surface, which improves the coverage of the first sealing film. This suppresses infiltration of moisture from the side wall of the organic photoelectric conversion film.

In the method of manufacturing the solid-state imaging device according to the embodiment of the present disclosure, the first sealing film is formed to cover the side wall of the organic photoelectric conversion film including the first inclined surface on the side wall and the second electrode. In this case, in the formation of the first sealing film, coverage of the first sealing film to the side wall of the organic photoelectric conversion film may become lower due to the film formation process; however, the side wall includes the first inclined surface, which improves the coverage of the first sealing film. This suppresses infiltration of moisture from the side wall of the organic photoelectric conversion film.

A second solid-state imaging device according to an embodiment of the present disclosure includes: a plurality of pixels each including a first electrode, an organic photoelectric conversion film, and a second electrode in this order on a substrate; a first sealing film formed, on the plurality of pixels, to cover a side wall of the organic photoelectric conversion film and the second electrode; and a second sealing film formed between the side wall of the organic photoelectric conversion film and the first sealing film.

In the second solid-state imaging device according to the embodiment of the present disclosure, the first sealing film is formed, on the plurality of pixels including the organic photoelectric conversion film, to cover the side wall of the organic photoelectric conversion film and the second electrode, and the second sealing film is formed between the first sealing film and the side wall of the organic photoelectric conversion film. In this case, coverage of the first sealing film to the side wall of the organic photoelectric conversion film may become lower due to the film formation process; however, interposition of the second sealing film suppresses infiltration of moisture from the side wall.

A third solid-state imaging device according to an embodiment of the present disclosure includes: a plurality of pixels each including a first electrode, an organic photoelectric conversion film, and a second electrode in this order on a substrate; and a first sealing film formed on the plurality of pixels. A plurality of the organic photoelectric conversion films are disposed separately for the respective pixels, and a third sealing film is formed to fill a region between side walls of the organic photoelectric conversion films adjacent to each other.

In the third solid-state imaging device according to the embodiment of the present disclosure, the first sealing film is formed on the plurality of pixels each including the organic photoelectric conversion film, and the third sealing film is formed to fill the region between the side wall of the organic photoelectric conversion films adjacent to each other. In this case, coverage of the first sealing film to the side walls of the organic photoelectric conversion films may become lower due to the film formation process; however, the above-described third sealing film is formed, which suppresses infiltration of moisture from the side walls of the respective organic photoelectric conversion films even in a case where the organic photoelectric conversion films are separated for the respective pixels.

According to the first solid-state imaging device and the method of manufacturing the solid-state imaging device of the respective embodiments of the present disclosure, the organic photoelectric conversion film includes the first inclined surface on the side wall in each of the plurality of pixels, and the first sealing film is formed, on the plurality of pixels, to cover the side wall of the organic photoelectric conversion film and the second electrode. This makes it possible to improve the coverage of the first sealing film and to suppress infiltration of moisture from the side wall of the organic photoelectric conversion film in a portion facing the side wall of the organic photoelectric conversion film. As a result, it is possible to secure sealing performance to suppress deterioration of the photoelectric conversion characteristics.

According to the second solid-state imaging device of the embodiment of the present disclosure, the first sealing film is formed, on the plurality of pixels including the organic photoelectric conversion film, to cover the side wall of the organic photoelectric conversion film and the second electrode, and the second sealing film is formed between the first sealing film and the side wall of the organic photoelectric conversion film. Interposition of the second sealing film makes it possible to suppress infiltration of moisture from the side wall of the organic photoelectric conversion film. As a result, it is possible to secure sealing performance to suppress deterioration of the photoelectric conversion characteristics.

According to the third solid-state imaging device of the embodiment of the present disclosure, the first sealing film is formed on the plurality of pixels each including the organic photoelectric conversion film, and the third sealing film is formed to fill the region between the side walls of the organic photoelectric conversion films adjacent to each other. This makes it possible to suppress infiltration of moisture from the side walls of the organic photoelectric conversion films. As a result, it is possible to secure sealing performance to suppress deterioration of the photoelectric conversion characteristics.

Note that the above-described contents are examples of the present disclosure. The effects achieved by the present disclosure are not limited to those described above, and other different effects may be achieved or other effects may be further included.

BRIEF DESCRIPTION OF DRAWINGS

FIG. 1 is a cross-sectional view of a configuration of a solid-state imaging device according to a first embodiment of the present disclosure.

FIG. 2 is a characteristic diagram illustrating relationship between an inclination angle of an inclined surface of an organic photoelectric conversion film and sealing property.

FIG. 3 is a schematic plan view to explain a film formation region of the organic photoelectric conversion film and an effective pixel region.

FIG. 4 is a flowchart illustrating an example of a method of manufacturing the solid-state imaging device illustrated in FIG. 1.

FIG. 5 is a cross-sectional schematic diagram illustrating a configuration of a solid-state imaging device according to a comparative example.

FIG. 6A is a cross-sectional schematic diagram illustrating a configuration of an organic photoelectric conversion film and a second electrode of a solid-state imaging device according to a modification example 1-1.

FIG. 6B is a cross-sectional schematic diagram illustrating a configuration of an organic photoelectric conversion film and a second electrode of a solid-state imaging device according to a modification example 1-2.

FIG. 7 is a cross-sectional schematic diagram illustrating a configuration of a main part of a solid-state imaging device according to a modification example 2.

FIG. 8 is a cross-sectional view of a configuration of a solid-state imaging device according to a second embodiment of the present disclosure.

FIG. 9A is a cross-sectional schematic diagram illustrating a configuration of a main part of a solid-state imaging device according to a modification example 3-1.

FIG. 9B is a cross-sectional schematic diagram illustrating a configuration of a main part of a solid-state imaging device according to a modification example 3-2.

FIG. 9C is a cross-sectional schematic diagram illustrating a configuration of a main part of a solid-state imaging device according to a modification example 3-3.

FIG. 10 is a cross-sectional view of a configuration of a solid-state imaging device according to a third embodiment of the present disclosure.

FIG. 11 is a cross-sectional view of a configuration of a solid-state imaging device according to a modification example 4.

FIG. 12 is a cross-sectional view of a configuration of a solid-state imaging device according to a modification example 5.

FIG. 13 is a block diagram illustrating a configuration of an imaging apparatus to which the solid-state imaging device illustrated in FIG. 1 is applied.

FIG. 14 is a schematic diagram illustrating a configuration example of the imaging apparatus illustrated in FIG. 13.

FIG. 15 is a functional block diagram illustrating an example of an application example (camera).

MODES FOR CARRYING OUT THE INVENTION

Embodiments of the present disclosure are described in detail below with reference to drawings. Note that description order is as follows.

1. First embodiment (an example of a solid-state imaging device including an inclined surface on a side wall of an organic photoelectric conversion film)
2. Modification examples 1-1 and 1-2 (examples in which an inclination angle of the side wall of the organic photoelectric conversion film and an inclination angle of a side wall of a second electrode are different from each other)
3. Modification example 2 (an example in which a plurality of organic photoelectric conversion films are formed separately for respective pixels)
4. Second embodiment (an example of a solid-state imaging device including a second sealing film between a side wall of an organic photoelectric conversion film and a first sealing film)
5. Modification examples 3-1 to 3-3 (other configuration examples including the second sealing film)
6. Third embodiment (an example of a solid-state imaging device including a third sealing film between side walls of organic photoelectric conversion films adjacent to each other)
7. Modification example 4 (an example in which a second electrode is formed to face side walls and top surfaces of organic photoelectric conversion films formed for respective pixels)
8. Modification example 5 (an example in which the second electrode is continuously formed as a layer common to organic photoelectric conversion films)
9. Application example 1 (an example of an entire imaging apparatus)
10. Application example 2 (an example of a camera)

First Embodiment

Configuration

FIG. 1 illustrates a cross-sectional configuration of a solid-state imaging device 1 according to a first embodiment of the present disclosure. The solid-state imaging device 1 is applied to, for example, a CCD or CMOS image sensor, etc.

In the solid-state imaging device 1, a plurality of pixels P are two-dimensionally arranged. Each of the pixels P includes a first electrode 13, an organic photoelectric conversion film 14, and a second electrode 15 on a semiconductor substrate 11 (substrate) with an interlayer insulation film 12 in between. A first sealing film 16 (first sealing film) is formed on the plurality of pixels P to cover the organic photoelectric conversion film 14 and the second electrode. An unillustrated protection film (or planarization film) and an unillustrated on-chip lens are formed on the first sealing film 16.

The solid-state imaging device 1 includes, for example, a structure in which photoelectric conversion devices are arranged along a vertical direction. The photoelectric conversion devices selectively detect light of different wavelength ranges and perform photoelectric conversion. Specifically, in the solid-state imaging device 1, the above-described organic photoelectric conversion film 14 is formed above the semiconductor substrate 11, and photoelectric conversion devices 110B and 110R (photodiodes) using, for example, an inorganic semiconductor are formed in the semiconductor substrate 11. In one pixel P, the stacked-layer structure of the organic photoelectric conversion film 14 and the photoelectric conversion devices 110B and 110R makes it possible to disperse, for example, color light of red (R), green (G), and blue (B) without using a color filter, and it is possible to obtain a plurality of kinds (here, three kinds of R, G, and B) of color signals from one pixel P.

The semiconductor substrate 11 includes a semiconductor layer 11a including, for example, silicon (Si), etc. on a front surface side, and, for example, the above-described photoelectric conversion devices 110B and 110R are embedded in the semiconductor layer 11a. For example, the photoelectric conversion devices 110B and 110R are each a photodiode including a pn junction, and are formed in order of the photoelectric conversion devices 110B and 110R from light entering side (surface S1 side). A supporting substrate 11c is provided, with a multilayer wiring layer 11b in between, on a surface S2 side opposite to the surface S1 of the semiconductor layer 11a. For example, a plurality of pixel transistors and logic circuits such as peripheral circuits are provided as driving devices to perform signal reading from the respective pixels P, on the surface S2 of the semiconductor layer 11a and the multilayer wiring layer 11b. Examples of the pixel transistor include a transfer transistor (TRF), a reset transistor (RST), an amplification transistor (AMP), a selection transistor (SEL), etc.

The photoelectric conversion device 110B selectively absorbs, for example, blue light (e.g., wavelength of 450 nm to 495 nm) to generate electric charges. The photoelectric conversion device 110R selectively absorbs, for example, red light (e.g., wavelength of 620 nm to 750 nm) to generate electric charges. These photoelectric conversion devices 110B and 110R each are coupled to the above-described transfer transistor through an unillustrated floating diffusion (FD).

A charge accumulation layer 112 that accumulates signal charges generated by the organic photoelectric conversion film 14 is formed in the semiconductor substrate 11 (semiconductor layer 11a). The charge accumulation layer 112 is, for example, an n-type or p-type impurity diffusion layer, and is electrically coupled to, for example, the first electrode 13. Specifically, the charge accumulation layer 112 and the first electrode 13 are coupled to each other through a wiring 111. As a result, for example, the signal charges collected in the first electrode 13 are accumulated in the charge accumulation layer 112, and then transferred to an unillustrated signal readout circuit through the transfer transistor Tr.

The interlayer insulation film 12 includes one or a plurality of insulation films. The interlayer insulation film 12 desirably has a small interface level, for example, in order to reduce an interface level with the semiconductor layer 11a (Si) and to suppress occurrence of a dark current from an interface between the interlayer insulation film 12 and the semiconductor layer 11a. In this case, insulation films 121 and 122 formed on the semiconductor layer 11a are stacked. The insulation film 121 is a hafnium oxide ($HfO_2$) film formed through, for example, an ALD (atomic layer deposition) method, and the insulation film 122 is a silicon oxide ($SiO_2$) film formed through, for example, a plasma CVD method. The structure and the formation method of the interlayer insulation film 12, however, are not limited thereto. The insulation film 122 also has a role of electrically separating the first electrodes 13 adjacent to each other.

The wiring 111 electrically couples the charge accumulation layer 112 and the first electrode 13 to each other. The wiring 111 may be used as a light shielding film through patterning in a plan view. In a case where the wiring 111 functions as the light shielding film while securing the electric coupling with silicon, it is possible to use, for example, a combination of a stacked-layer film of titanium (Ti) and titanium nitride (TiN) as barrier metals and tungsten (W) for the wiring 111.

The first electrodes 13 are provided, for example, for the respective pixels (a plurality of first electrodes 13 are provided on semiconductor substrate 11). The plurality of first electrodes 13 are electrically separated between adjacent pixels P by the interlayer insulation film 12. The electric charges (e.g., holes or electrons) are read out as the signal charges through the first electrodes 13. As described above, the first electrodes 13 are electrically coupled to the charge accumulation layers 112 formed in the semiconductor substrate 11. The first electrodes 13 each include an electroconductive film (transparent electroconductive film) transparent to visible light in this case. Examples of the transparent electroconductive film include ITO (indium tin oxide). As the constituent material of the first electrodes 13, however, a tin oxide material prepared by adding a dopant to tin oxide ($SnO_2$) or a zinc oxide material prepared by adding a dopant to zinc oxide (ZnO) may be used in addition to ITO. Examples of the zinc oxide material include aluminum zinc oxide (AZO) added with aluminum (Al) as a dopant, a gallium zinc oxide (GZO) added with gallium (Ga), and an indium zinc oxide (IZO) added with indium (In). In addition, it is possible to use IGZP, CuI, $InSbO_4$, ZnMgO, $CuInO_2$, $MgIn_2O_4$, CdO, $ZnSnO_3$, etc.

The organic photoelectric conversion film 14 includes an organic semiconductor that absorbs light of a selective wavelength (e.g., green light having wavelength of about 495 nm to about 570 nm), to generate electron-hole pairs. The organic photoelectric conversion film 14 is continuously provided as a layer common to the plurality of first electrodes 13 in this case. The first electrode 13 and the second electrode 15 are provided as a pair of electrodes to extract the electric charges from the organic photoelectric conversion film 14.

The organic photoelectric conversion film 14 includes one or both of p-type and n-type organic semiconductors. Examples of the preferred structure of the organic photoelectric conversion film 14 include a so-called p-i-n bulk hetero-structure that includes a p-type blocking layer 14$p$, a co-vapor deposition layer 14$i$ containing p-type and n-type materials, and an n-type blocking layer 14$n$ in order from the first electrodes 13 side.

Examples of the organic semiconductor include quinacridone (including quinacridone derivative). The organic semiconductor used in the organic photoelectric conversion film 14, however, is not limited thereto, and it is possible to use various organic semiconductors as described below. For example, one or more of subphthalocyanine, naphthalene, anthracene, phenanthrene, tetracene, pyrene, perylene, fluoranthene, and the like (each including derivative thereof) may be used. Alternatively, a polymer or a derivative of phenylenevinylene, fluorene, carbazole, indole, pyrene, pyrrole, picoline, thiophene, acetylene, diacetylene, and the like may be used. In addition, metal complex dyes, cyanine-based dyes, merocyanine-based dyes, phenylxanthene-based dyes, triphenylmethane-based dyes, rhodacyanine-based dyes, xanthene-based dyes, macrocyclic aza-annulene-based dyes, azulene-based dyes, naphthoquinone-based dyes, anthraquinone-based dyes, chain compounds obtained by condensation between condensed polycyclic aromatic compounds, such as anthracene and pyrene, and aromatic or hetero ring compounds, two nitrogen-containing heterocyclic rings, such as quinolone, benzothiazole, and benzooxazole, having a squarylium group and a croconic methine group as bonding chains, and cyanine analogue dyes bonded by a squarylium group and a croconic methine group may be used. Note that examples of the metal complex dyes include dithiol metal complex dyes, metal phthalocyanine dyes, metal porphyrin dyes, and ruthenium complex dyes. Further, the organic photoelectric conversion film 14 may contain, for example, fullerene (C60) and BCP (Bathocuproine), in addition to the above-described materials.

The second electrode 15 includes an electroconductive film (transparent electroconductive film) transparent to visible light. Examples of the transparent electroconductive film include ITO (indium tin oxide). As the constituent material of the second electrode 15, however, a tin oxide material prepared by adding a dopant to tin oxide ($SnO_2$), or a zinc oxide material prepared by adding a dopant to zinc oxide (ZnO) may be used in addition to ITO. Examples of the zinc oxide material include aluminum zinc oxide (AZO) added with aluminum (Al) as a dopant, gallium zinc oxide (GZO) added with gallium (Ga), and indium zinc oxide (IZO) added with indium (In). In addition, it is possible to use IGZP, CuI, $InSbO_4$, ZnMgO, $CuInO_2$, $MgIn_2O_4$, CdO, $ZnSnO_3$, etc. Note that, in a case where the signal charges are read from the first electrodes 13, the electric charges extracted from the second electrode 15 are discharged through a wiring 114. Therefore, the second electrode 15 is continuously formed as an electrode common to the pixels P. The second electrode 15, however, may be separated for each of the pixels.

The wiring 114 includes one or more of, for example, tungsten (W), titanium (Ti), titanium nitride (TiN), and aluminum (Al).

Note that a lower buffer layer may be formed between the first electrodes 13 and the organic photoelectric conversion film 14, and an upper buffer layer may be formed between the organic photoelectric conversion film 14 and the second electrode 15. Each of the lower buffer layer and the upper buffer layer contains, for example, an organic semiconductor material used in the organic photoelectric conversion film 14, and functions as, for example, an electron blocking film, a hole blocking film, or a work function adjustment film.

In the present embodiment, the organic photoelectric conversion film 14 includes an inclined surface t1 (first inclined surface) on a side wall 140. In other words, the organic photoelectric conversion film 14 includes a tapered shape (forward tapered shape) tapered from the first electrodes 13 toward the second electrode 15. The second electrode 15 includes an inclined surface t2 (second inclined surface) on its side wall 150. An inclination angle a1 of the inclined surface t1 and an inclination angle a2 of the inclined surface t2 may be equal to each other or different from each other as described later. In this case, the inclination angles a1 and a2 are equal to each other. Further, the inclined surface t2 is provided continuously to, for example, the inclined surface t1 of the organic photoelectric conversion film 14.

FIG. 2 illustrates relationship between the inclination angle a1 of the organic photoelectric conversion film 14 and sealing property. The sealing property is evaluated with use of TDS (Thermal Desorption Spectrometry) in which a sealing film is formed to cover an LTO (Low Temperature Oxide) film and an amount of water ($H_2O$) desorbed from the LTO film through the sealing film is measured. As illustrated, the sealing property is drastically lowered at the inclination angle a1 of about 90 degrees, and in a case where the inclination angle a1 exceeds 90 degrees (in a case where a shape of organic photoelectric conversion film 14 becomes a reversed tapered shape), the sealing property is not sufficiently secured. This is because, although it is possible to form the first sealing film 16 through, for example, the CVD method, the ALD method, or the PVD method, film quality in a portion covering the side wall 140 of the first sealing film 16 is largely deteriorated due to the low-temperature process, which easily results in a sparse film in the case where the CVD method or the ALD method of these methods is used, and it is not possible for the first insulation film 16 to cover the side wall 140 in principle in a case where the PVD method is used. For the reason, the inclination angle a1 of the side wall 140 of the organic photoelectric conversion film 14 is set lower than 90 degrees, namely, the side wall 140 of the organic photoelectric conversion film 14 has the inclined surface t1.

For example, the inclined surfaces t1 and t2 are desirably formed through collective (or continuous) processing of the organic photoelectric conversion film 14 and the second electrode 15 in a manufacturing process described later. The first sealing film 16 is formed to cover the side wall 140 of the organic photoelectric conversion film 14 and the second electrode 15 (specifically, a top surface and the side wall 150 of the second electrode 15).

The first sealing film 16 has a function of suppressing infiltration (penetration) of moisture to the inside of each of the pixels P, specifically, to the organic photoelectric conversion film 14. The first sealing film 16 contains one or more of inorganic materials such as silicon oxide ($SiO_2$), silicon nitride (SiN), silicon oxynitride (SiON), and aluminum oxide ($AlO_3$). In the present embodiment, the first sealing film 16 is formed in contact with the side wall 140 of the organic photoelectric conversion film 14. Therefore, as illustrated in FIG. 3, a sufficient distance d1 is desirably secured between an effective pixel region 10A and a film formation region 10B of the first sealing film 16. This makes it possible to reduce influence on the organic photoelectric conversion film 14 formed in the effective pixel region 10A in the formation process of the first sealing film 16. The first sealing film 16 is formed with use of, for example, an Atomic Layer Deposition (ALD) method, a Chemical Vapor Deposition (CVD) method, or a Physical Vapor Deposition method.

Manufacturing Method

FIG. 4 is a flowchart to explain main processes in a method of manufacturing the solid-state imaging device 1. As illustrated, the semiconductor substrate 11 is first formed (step S11). Specifically, a so-called SOI substrate (not illustrated) that includes the semiconductor layer 11a on a silicon base material with a silicon oxide layer in between is prepared, and the wirings 111 including the above-described material are formed in the semiconductor layer 11a. Thereafter, for example, the photoelectric conversion devices 110B and 110B respectively including a p-type region and an n-type region, and the charge accumulation layer 112 are formed in regions different in depth in the semiconductor layer 11a (so as to overlap with one another) through, for example, ion injection. Further, the pixel transistors such as the transfer transistor and the peripheral circuits such as the logic circuit are formed on the front surface (surface S2) of the semiconductor layer 11a. The multilayer wiring layer 11b including a plurality of wirings 113 is formed on the surface S2 of the semiconductor layer 11a. Subsequently, the supporting substrate 11c is bonded to one surface of the multilayer wiring layer 11b, and the silicon base material and the silicon oxide layer are then peeled off from the SOI substrate, to expose the surface S1 of the semiconductor layer 11a.

Next, the first electrodes 13 are formed on the semiconductor substrate 11 with the interlayer insulation film 12 in between (step S12). Specifically, a hafnium oxide film (insulation film 121) is first formed on the surface S1 of the semiconductor substrate 11 through, for example, the ALD (atomic layer deposition) method, and then the insulation film 122 and the first electrodes 13 are formed. The insulation film 122 is formed with use of silicon oxide through, for example, a plasma CVD (Chemical Vapor Deposition) method. At this time, the insulation film 122 is formed in a region between the first electrodes 13, and the front surface thereof is planarized through, for example, a CMP (Chemical Mechanical Polishing) method, which makes it possible to electrically separate the first electrodes 13 from one another. The first electrodes 13 are formed through film formation of the above-described material with use of, for example, a sputtering method, then patterning with use of photolithography technique, followed by processing with use of dry etching or wet etching. Note that the first electrodes 13 and the wirings 111 may be patterned in an optional order.

Subsequently, the organic photoelectric conversion film 14 is formed (step S13). Specifically, the organic photoelectric conversion film 14 is formed by depositing an organic semiconductor material including the above-described material on the first electrodes 13 through, for example, a vacuum vapor deposition method. Note that, as the vacuum vapor deposition method, it is possible to use, for example, an electron beam heating system and a resistance heating system. In addition, the lower buffer layer, the upper buffer layer, etc. may be formed as necessary. Furthermore, the film formation method of the organic photoelectric conversion film 14 is not limited to the vacuum vapor deposition method, and a coating method may be used.

Next, the second electrode 15 is formed (step S14). The characteristics of the organic photoelectric conversion film 14 are typically largely varied due to influence of moisture, oxygen, hydrogen, etc. Therefore, the second electrode 15 is desirably formed in vacuum, together with the organic photoelectric conversion film 14. It is possible to form the second electrode 15 by, for example, a vacuum vapor deposition method or a sputtering method.

Subsequently, the formed organic photoelectric conversion film 14 and the formed second electrode 15 are processed (step S15). Specifically, patterning is performed with use of, for example, photolithography technique, and then the second electrode 15 and the organic photoelectric conversion film 14 are collectively processed through, for example, dry etching. Thereafter, processing such as ashing is performed to remove deposits and residues. Note that, in this case, the organic photoelectric conversion film 14 and the second electrode 15 are formed, and are then processed with use of photolithography and dry etching; however, the formation method of the organic photoelectric conversion film 14 and the second electrode 15 is not limited thereto. It is possible to form, for example, the organic photoelectric conversion film 14 and the second electrode 15 by pattern formation with use of a shadow mask, etc.

As a result, the inclined surfaces t1 and t2 are respectively formed on the side wall 140 of the organic photoelectric conversion film 14 and the side wall 150 of the second electrode 15. Note that adjusting conditions of the etching makes it possible to form the side walls 140 and 150 such that the inclination angles a1 and a2 of the inclined surfaces t1 and t2 are equal to or different from each other.

Thereafter, the first sealing film 16 is formed (step S16). Specifically, the first sealing film 16 including the above-described material is formed with use of a film formation method using low-temperature process, such as the CVD method, the ALD method, and the PVD method. As a result, the side wall 140 of the organic photoelectric conversion film 14 and the second electrode 15 are covered with the first sealing film 16. Thereafter, the wiring 114 electrically coupled to the second electrode 15 is formed. Finally, although not illustrated, the planarization film, the on-chip lens, etc. are formed. This results in the solid-state imaging device 1 illustrated in FIG. 1.

Effects

In the solid-state imaging device 1 as described above, in a case where light enters the organic photoelectric conversion film 14 through the first sealing film 16 and the second electrode 15, a portion of the entering light (e.g., green light) is selectively absorbed. As a result, in the organic photoelectric conversion film 14, electron-hole pairs are generated (photoelectric conversion is performed), and one of the electrons and the holes are collected, for example, on the first electrodes 13 side and are accumulated in the charge accumulation layers 112 in the semiconductor substrate 11. The electric charges accumulated in the charge accumulation layers 112 are read out as the electric signal to the peripheral circuits through the transfer transistor Tr. In contrast, light having passed through the organic photoelectric conversion film 14 (e.g., blue light and red light) is sequentially absorbed by the photoelectric conversion devices 110B and 110R in the semiconductor substrate 11 and is photoelectrically converted, and is read out as an electric signal for each color.

In this case, in the solid-state imaging device 1 having the above-described organic photoelectric conversion film 14, the first sealing film 16 that covers the plurality of pixels P is formed in order to prevent moisture from infiltrating into the pixels P. Further, the organic photoelectric conversion film 14 is weak to heat. Therefore, the first sealing film 16 is desirably formed through a film formation method (such as CVD method, ALD method, and PVD method) using a low-temperature process.

In a case where any of these film formation methods is used, however, coverage of the film is not favorable, which makes the first sealing film 16 difficult to exert sufficient sealing performance in particular on the side wall of the organic photoelectric conversion film 14. FIG. 5 illustrates a configuration of a main part of a solid-state imaging device 100 according to a comparative example. As illustrated, in the solid-state imaging device 100 according to the comparative example, first electrodes 102, an organic photoelectric conversion film 103, and a second electrode 104 are formed in this order on an interlayer insulation film 101 as with the solid-state imaging device 1 according to the present embodiment. A sealing film 105 is formed to cover the organic photoelectric conversion film 103 and the second electrode 104. A wiring 106 that is electrically coupled to the second electrode 104 is formed on the sealing film 105. A side wall 1030 of the organic photoelectric conversion film 103, however, does not include an inclined surface and is perpendicular to a substrate surface. In such a configuration, in a case where the sealing film 105 is formed through, for example, the CVD method, the ALD method, the PVD method, or the like described above, coverage of the side wall 1030 of the organic photoelectric conversion film 103 is deteriorated. Specifically, film quality of the sealing film 105 is deteriorated or unevenness of a film thickness occurs with respect to the side wall 1030 of the organic photoelectric conversion film 103. A so-called notched (concave) shape X11, a reversed tapered shape X12, etc. are generated, which makes moisture easy to infiltrate from the side wall 1030. As a result, photoelectric conversion characteristics of the organic photoelectric conversion film 103 are deteriorated.

In contrast, in the present embodiment, the organic photoelectric conversion film 14 includes the inclined surface t1 on the side wall 140. Therefore, even in the case where the first sealing film 16 is formed through, for example, the CVD method, the ALD method, the PVD method, or the like, coverage of the first sealing film 16 to the side wall 140 is improved. Specifically, it is difficult to form the notched shape X11 and the reversed tapered shape X12 described above in a portion facing the side wall 140 of the first sealing film 16, which makes it possible to cover the side wall 140 with the first sealing film 16 having a uniform thickness and favorable film quality. This makes it possible to suppress infiltration of moisture from the side wall 140 of the organic photoelectric conversion film 14.

Further, in the present embodiment, the second electrode 15 includes the inclined surface t2 on the side wall 150. Therefore, as compared with a case where the side wall 150 of the second electrode 15 does not include the inclined surface t2 (is a perpendicular surface), the material of the first sealing film 16 is easily adhered to the organic photoelectric conversion film 14, which makes it possible to improve sealing performance of the first sealing film 16.

As described above, in the present embodiment, in the plurality of pixels P, the organic photoelectric conversion film 14 includes the inclined surface t1 on the side wall 140, and the first sealing film 16 that covers the side wall 140 of the organic photoelectric conversion film 14 and the second electrode 15 is formed on the plurality of pixels P. Accordingly, coverage of the first sealing film 16 is improved in the portion facing the side wall 140 of the organic photoelectric conversion film 14, which makes it possible to suppress infiltration of moisture to the organic photoelectric conversion film 14 from the side wall 140. Therefore, it is possible to secure sealing performance to suppress deterioration of the photoelectric conversion characteristics.

Next, other embodiments and modification examples of the above-described first embodiment are described. In the following, components similar to those of the above-described first embodiment are denoted by the same reference numerals and description of such components is appropriately omitted.

Modification Examples 1-1 and 1-2

FIG. 6A schematically illustrates a configuration of the organic photoelectric conversion film 14 and the second electrode 15 of a solid-state imaging device according to a modification example 1-1 of the above-described first embodiment. FIG. 6B schematically illustrates a configuration of the organic photoelectric conversion film 14 and the second electrode 15 of a solid-state imaging device according to a modification example 1-2. In the above-described first embodiment, the case where the inclination angle a1 of the inclined surface t1 of the organic photoelectric conversion film 14 and the inclination angle a2 of the inclined surface t2 of the second electrode 15 are equivalent to each other has been described; however, the inclination angles a1 and a2 may be different from each other. In particular, the inclination angle a2 is desirably equal to the inclination angle a1 or smaller than the inclination angle a1 as illustrated in FIG. 6A (inclination angle a2 is desirably an angle equal to or lower than inclination angle a1), which makes it possible to enhance sealing performance of the first sealing film 16. Further, an allowable range for the inclination angle a2 is less than 90 degrees, and the inclination angle a2 may be larger than the inclination angle a1 as illustrated in FIG. 6B.

Modification Example 2

FIG. 7 schematically illustrates a configuration of a main part of a solid-state imaging device according to a modification example 2 of the above-described first embodiment. In the above-described first embodiment, the configuration in which the organic photoelectric conversion film 14 is continuously formed as the layer common to the plurality of pixels P (plurality of first electrodes 13) has been exemplified; however, the organic photoelectric conversion film 14 may be separated for each of the pixels P as in the present modification example. As described above, in the present modification example, the plurality of organic photoelectric conversion films 14 are provided corresponding to the first electrodes 13. Even in this case, each of the organic photoelectric conversion films 14 includes the inclined surface t1 on the side wall 140, which makes it possible to improve sealing performance of the first sealing film 16. Therefore, it is possible to achieve effects similar to those of the above-described first embodiment.

Second Embodiment

FIG. 8 illustrates a cross-sectional configuration of a solid-state imaging device according to a second embodiment of the present disclosure. The solid-state imaging device of the present embodiment is also applied to, for example, a CCD or CMOS image sensor, etc. as with the above-described first embodiment, and includes the plurality of pixels P two-dimensionally arranged. Each of the pixels P includes the first electrode 13, the organic photoelectric conversion film 14, and the second electrode 15 on the semiconductor substrate 11 (substrate) with the interlayer insulation film 12 in between. The first sealing film 16 (first sealing film) that covers the organic photoelectric conversion film 14 and the second electrode 15 is formed on the plurality of pixels P. The organic photoelectric conversion film 14 is formed above the semiconductor substrate 11, and the photoelectric conversion devices 110B and 110R are formed in the semiconductor substrate 11. In one pixel P, the stacked-layer structure of the organic photoelectric conversion film 14 and the photoelectric conversion devices 110B and 110R makes it possible to disperse, for example, color light of red (R), green (G), and blue (B) without using a color filter, and it is possible to obtain a plurality of kinds (here, three kinds of R, G, and B) of color signals from one pixel P.

In the present embodiment, however, a second sealing film 17 is formed between the side wall 140 of the organic photoelectric conversion film 14 and the first sealing film 16 unlike the above-described first embodiment. The second sealing film 17 functions as a so-called side wall, and is formed in contact with the side wall 140 of the organic photoelectric conversion film 14 and the side wall 150 of the second electrode 15. The second sealing film 17 contains one or more of inorganic materials, a film of which is formable through, for example, the PVD method, such as silicon nitride, silicon oxide, and silicon oxynitride. The constituent material of the second sealing film 17 may be the same as or different from the constituent material of the first sealing film 16.

Note that FIG. 8 illustrates the configuration in which the side wall 140 of the organic photoelectric conversion film 14 and the side wall 150 of the second electrode 15 are inclined (have inclined surfaces). The second sealing film 17 and the first sealing film 16 may be formed to cover the side wall 140 having the inclined surface as with the above-described first embodiment, which makes it possible to enhance sealing performance, as compared with the above-described first embodiment.

As described above, in the present embodiment, the second sealing film 17 is interposed between the side wall 140 of the organic photoelectric conversion film 14 and the first sealing film 16, which suppresses infiltration of moisture to the organic photoelectric conversion film 14 from the side wall 140. Therefore, it is possible to achieve effects similar to those of the above-described first embodiment.

Further, providing the second sealing film 17 makes it possible to reduce damage to the organic photoelectric conversion film 14 in the formation of the first insulation film 16. This makes it possible to effectively suppress deterioration of the photoelectric conversion characteristics.

Modification Examples 3-1 to 3-3

FIG. 9A schematically illustrates a configuration of a main part of a solid-state imaging device according to a modification example 3-1 of the above-described second embodiment. In the above-described second embodiment, the configuration in which the side wall 140 of the organic photoelectric conversion film 14 and the side wall 150 of the second electrode 15 are inclined (have inclined surfaces) has been described; however, the side walls 140 and 150 may not be inclined (may be perpendicular to the substrate surface) as in the present modification example. This is because interposition of the second sealing film 17 makes it possible to enhance sealing performance even if the side wall 140 is perpendicular. As described above, however, the second sealing films 17 and the first sealing film 16 are desirably formed to cover the side wall 140 having the inclined surface because sealing performance is enhanced.

FIG. 9B schematically illustrates a configuration of a main part of a solid-state imaging device according to a modification example 3-2 of the above-described second embodiment. In the above-described second embodiment, the configuration in which the organic photoelectric conversion film 14 is continuously formed as the layer common to the plurality of pixels P (the plurality of first electrodes 13) has been exemplified; however, the organic photoelectric conversion film 14 may be separated for each of the pixels P as in the present modification example. In the present modification example, the plurality of organic photoelectric conversion films 14 are provided corresponding to the first electrodes 13. Even in this case, the second sealing films 17 are formed to cover the side walls 140 of the respective organic photoelectric conversion films 14, which makes it possible to improve sealing performance of the solid-state imaging device, and to achieve effects similar to those of the above-described first embodiment.

FIG. 9C schematically illustrates a configuration of a main part of a solid-state imaging device according to a modification example 3-3 of the above-described second embodiment. In the configuration in which the plurality of organic photoelectric conversion films 14 are formed separately for the respective pixels P and each have the inclined surface t1 on the side wall 140, the second sealing films 17 may be formed to cover the respective side walls 140, as in the present modification example.

Third Embodiment

FIG. 10 illustrates a cross-sectional configuration of a solid-state imaging device according to a third embodiment of the present disclosure. The solid-state imaging device of the present embodiment is also applied to, for example, a CCD or CMOS image sensor, etc., as with the above-described first embodiment, and includes the plurality of pixels P two-dimensionally arranged. Each of the pixels P includes the first electrode 13, the organic photoelectric conversion film 14, and the second electrode 15 on the semiconductor substrate 11 (substrate) with the interlayer insulation film 12 in between. The first sealing film 16 (first sealing film) that covers the organic photoelectric conversion films 14 and the second electrodes 15 is formed on the plurality of pixels P. The organic photoelectric conversion films 14 are provided above the semiconductor substrate 11, and the photoelectric conversion devices 110B and 110R are formed in the semiconductor substrate 11. In one pixel P, the stacked-layer structure of the organic photoelectric conversion film 14 and the photoelectric conversion devices 110B and 110R makes it possible to disperse, for example, color light of red (R), green (G), and blue (B) without using a color filter, and it is possible to obtain a plurality of kinds (here, three kinds of R, G, and B) of color signals from one pixel P.

In the present embodiment, however, the plurality of organic photoelectric conversion films 14 are formed separately for the respective pixels P unlike the above-described first embodiment. The organic photoelectric conversion films 14 are formed for the respective pixels P by selectively removing, for example, a region between the pixels P through, for example, dry etching. FIG. 10 illustrates a region corresponding to selective two pixels in the solid-state imaging device. In the present embodiment, a third sealing film 18 is formed in a region between the side walls 140 of the organic photoelectric conversion films 14 adjacent to each other. The second electrodes 15 are formed corresponding to the organic photoelectric conversion films 14 for the respective pixels P. The wirings 114 are provided for the respective second electrodes 15.

The third sealing film 18 is formed so as to fill the region (recessed portion) between the side walls 140. The third sealing film 18 is to prevent moisture from infiltrating into the organic photoelectric conversion films 14 as with the first sealing film 16. For example, the third sealing film 18 contains the constituent material of the first sealing film 16 (such as silicon oxide, silicon nitride, and silicon oxynitride), or contains one or more of aluminum oxide ($AlO_x$), carbon-containing silicon oxide (SiOC), tungsten (W), and aluminum (Al). As the constituent material of the third sealing film 18, the material same as the material of the first sealing film 16 may be selected; however, a material having a refractive index lower than that of the first sealing film 16 (e.g., an inorganic material or metal having a low refractive index) is desirably selected. Specifically, for example, one or more of aluminum oxide ($AlO_x$), carbon-containing silicon oxide (SiOC), tungsten (W), and aluminum (Al) are desirably used for the third sealing film 18. This is because the material allows the third sealing film 18 to function as a reflection film and enhances light collection efficiency for each of the pixels P.

As described above, in the present embodiment, the third sealing film 18 is formed in the region between the side walls 140 of the organic photoelectric conversion films 14 adjacent to each other, which suppresses infiltration of moisture to the organic photoelectric conversion films 14 through the side walls 140 even in the case where the plurality of organic photoelectric conversion films 14 are formed separately for the respective pixels. This makes it possible to achieve effects similar to those of the above-described first embodiment.

Further, in the present embodiment, the third sealing film 18 includes the material having the refractive index lower than that of the first sealing film 16 to function as the reflection film, which makes it possible to enhance light collection efficiency for each of the pixels P. This also makes it possible to improve sensitivity.

Note that, in the above-described third embodiment, the side walls 140 of the organic photoelectric conversion films 14 and the side walls 150 of the second electrodes 15 may be inclined or not be inclined (may be perpendicular to the substrate surface). This is because the third sealing film 18 makes it possible to enhance sealing performance to the side walls 140 even if the side walls 140 are perpendicular. However, forming the third sealing film 18 in the region between the side walls 140 each having the inclined surface makes it possible to further enhance the sealing performance.

Modification Example 4

FIG. 11 illustrates a cross-sectional configuration of a solid-state imaging device according to a modification example 4. In the present modification example, in the configuration in which the plurality of organic photoelectric conversion films 14 are provided separately for the respective pixels P, each of second electrodes (second electrodes 15A) is continuously formed over a region facing the top surface and a region facing the side wall 140 of each of the organic photoelectric conversion films 14. Moreover, in the present modification example, the second electrodes 15A are formed for the respective pixels P so as to cover the respective organic photoelectric conversion films 14. The wirings 114 are provided for the respective second electrodes 15A.

The present modification example illustrates a configuration in which the side walls 140 of the organic photoelectric conversion films 14 and the side walls 150 of the second electrodes 15 are inclined (each have inclined surface). Each of the second electrodes 15A is formed to cover the side wall 140 having the inclined surface as with the above-described first embodiment. In other words, each of the second electrodes 15A is interposed between the side wall 140 of the organic photoelectric conversion film 14 and the first sealing film 16.

As described above, the second electrodes 15A may cover the side walls 140 of the respective organic photoelectric conversion films 14 in the configuration in which the organic photoelectric conversion films 14 are separated for the respective pixels P. This makes it possible to allow the second electrodes 15A to function as the sealing films, and to suppress infiltration of moisture to the organic photoelectric conversion films 14 from the side walls 140. Accordingly, it is possible to achieve effects similar to those in the above-described first embodiment, etc.

Not that, even in the above-described modification example 4, the side walls 140 of the organic photoelectric conversion films 14 and the side walls 150 of the second electrodes 15 may be inclined or not be inclined (may be perpendicular to the substrate surface). This is because interposition of the second electrodes 15A makes it possible to enhance sealing performance to the side walls 140 even if the side walls 140 are perpendicular. However, forming the second electrodes 15A to cover the side walls 140 each having the inclined surface makes it possible to further enhance the sealing performance.

Modification Example 5

FIG. 12 illustrates a cross-sectional configuration of a solid-state imaging device according to a modification example 5. In the present modification example, in the configuration in which the plurality of organic photoelectric conversion films 14 are formed separately for the respective pixels P, a second electrode (second electrode 15B) is continuously provided over the region facing the top surface and the region facing the side wall 140 of each of the organic photoelectric conversion films 14. In addition, in the present modification example, the second electrode 15B is continuously formed as a layer common to the plurality of pixels P (the plurality of organic photoelectric conversion films 14), so as to cover the organic photoelectric conversion films 14.

The present modification example illustrates a configuration in which the side walls 140 of the organic photoelectric conversion films 14 are inclined (have inclined surfaces). The second electrode 15B is formed to cover the side walls 140 each having the inclined surface as with the above-described first embodiment. In other words, the second electrode 15B is interposed between the side walls 140 of the organic photoelectric conversion films 14 and the first sealing film 16.

As described above, the second electrode 15B may cover the side walls 140 of the organic photoelectric conversion films 14 in the configuration in which the organic photoelectric conversion films 14 are separated for the respective pixels P. This makes it possible to allow the second electrode 15B to function as the sealing film, and to suppress infiltration of moisture to the organic photoelectric conversion films 14 from the side walls 140. Accordingly, it is possible to achieve effects similar to those in the above-described first embodiment, etc.

Note that, even in the above-described modification example 5, the side walls 140 of the organic photoelectric conversion films 14 may be inclined or not be inclined (may be perpendicular to the substrate surface). This is because interposition of the second electrode 15B makes it possible to enhance sealing performance to the side walls 140 even if the side walls 140 are perpendicular. However, forming the second electrode 15B to cover the side walls 140 each having the inclined surface makes it possible to further enhance the sealing performance.

Application Example 1

FIG. 13 illustrates a functional configuration of an imaging apparatus 2 in which the solid-state imaging device 1 described in the above-described first embodiment, etc. is used in a pixel section 10. The imaging apparatus 2 includes the pixel section 10 as an imaging region, and includes a circuit section 20 as a peripheral circuit of the pixel section 10. The circuit section 20 includes, for example, a row scanner 131, a horizontal selector 133, a column scanner 134, and a system controller 132.

The pixel section 10 includes, for example, the plurality of pixels P that are two-dimensionally arranged in a matrix. For example, a pixel driving line Lread (e.g., a row selection line and a reset control line) is wired for each pixel row of the pixels P, and a vertical signal line Lsig is wired for each pixel column of the pixels P. The pixel drive line Lread transmits a driving signal to read out signals from the pixels P. One end of the pixel drive line Lread is coupled to an output end corresponding to each row of the row scanner 131.

The row scanner 131 is a pixel driver that includes, for example, a shift register, an address decoder, etc., and drives the respective pixels P of the pixel section 10, for example, on a row basis. The signals outputted from the respective pixels P on the pixel row selectively scanned by the row scanner 131 are supplied to the horizontal selector 133 through the respective vertical signal lines Lsig. The horizontal selector 133 includes, for example, an amplifier, a horizontal selection switch, etc. that are provided for each vertical signal line Lsig.

The column scanner 134 includes, for example, a shift register, an address decoder, etc., and sequentially drives the horizontal selection switches of the horizontal selector 133 while performing scanning. Through selection scanning performed by the column scanner 134, signals of the respective pixels transmitted through the respective vertical signal lines Lsig are sequentially outputted to the horizontal signal line 135, and are transmitted to outside of the semiconductor substrate 11 through the horizontal signal line 135, or are provided to an unillustrated signal processor.

In the imaging apparatus 2, for example, a substrate 2A including the pixel section 10 and a substrate 2B including the circuit portion (signal processing circuit) that includes the row scanner 131, the horizontal selector 133, the column scanner 134, the horizontal signal line 135, etc., are stacked as illustrated in FIG. 14. The configuration, however, is not limited thereto, and the above-described circuit portion may be formed on the same substrate as the pixel section 10, or may be disposed on an external control IC. Further, the circuit portion may be formed on the other substrate that is coupled through a cable, etc.

The system controller 132 receives a clock provided from outside, data instructing an operation mode, etc., and outputs data such as internal information of the solid-state imaging device 1. The system controller 132 further includes a timing generator that generates various kinds of timing signals, and performs driving control of peripheral circuits such as the row scanner 131, the horizontal selector 133, and the column scanner 134, on the basis of the various kinds of timing signals generated by the timing generator.

Application Example 2

The above-described solid-state imaging device 1 is applicable to all types of electronic apparatuses including an imaging function, for example, a camera system such as a digital still camera and a video camera, and a mobile phone including an imaging function. FIG. 15 illustrates a schematic configuration of an electronic apparatus 3 (camera) as an example. The electronic apparatus 3 is, for example, a camera that is allowed to capture a still image or a moving image, and includes the solid-state imaging device 1, an optical system (optical lens) 310, a shutter unit 311, a driver 313 that drives the solid-state imaging device 1 and the shutter unit 311, and a signal processor 312.

The optical system 310 guides image light (entered light) from an object to the solid-state imaging device 1. The optical system 310 may include a plurality of optical lenses. The shutter unit 311 controls a light irradiation period and a light shielding period to the solid-state imaging device 1. The driver 313 controls transfer operation of the solid-state imaging device 1 and shutter operation of the shutter unit 311. The signal processor 312 performs various kinds of signal processing on the signals outputted from the solid-state imaging device 1. An image signal Dout subjected to the signal processing is stored in a storage medium such as a memory, or outputted to a monitor, etc.

As described above, the present disclosure has been described with reference to the embodiments and the modification examples; however, the contents of the present disclosure are not limited to the above-described embodiments, etc., and various modification may be made. For example, the layer configuration of the photoelectric conversion device described in the above-described embodiments is illustrative, and may further include other layers. In addition, the materials and the thicknesses of the respective layers are also illustrative and are not limited to those described above.

Further, in the above-described embodiments, etc., the back-illuminated solid-state imaging device has been described as an example; however, the solid-state imaging device of the present disclosure is applicable to a front-illuminated device structure.

Further, in the above-described embodiments, etc., as the solid-state imaging device, the organic photoelectric conversion film 14 detecting the green light and the photoelectric conversion devices 110B and 110R respectively detecting the blue light and the red light are stacked in one pixel; however, the contents of the present disclosure is not limited to such a structure. In other words, the organic photoelectric conversion film formed on the substrate may detect red light or blue light, or a plurality of kinds of organic photoelectric conversion films that respectively photoelectrically converts color light of red, green, and blue may be stacked. As described above, the number of the organic photoelectric conversion films formed on the semiconductor substrate, the number of photoelectric conversion devices formed in the semiconductor substrate, and the combination thereof are not particularly limited. In addition, the photoelectric conversion devices of the respective colors may be two-dimensionally arranged without limitation to the structure in which the plurality of photoelectric conversion devices are stacked in one pixel. Moreover, a color filter may be provided. The present disclosure is applicable to all kinds of solid-state imaging devices including the organic photoelectric conversion film.

Further, the effects described in the above-described embodiments, etc. are illustrative, and other effects may be achieved or other effects may be further included.

It is to be noted that the present disclosure may have the following configuration.

(1)

A solid-state imaging device, including:

a plurality of pixels each including a first electrode, an organic photoelectric conversion film, and a second electrode in this order on a substrate, the organic photoelectric conversion film including a first inclined surface on a side wall; and a first sealing film formed, on the plurality of pixels, to cover the side wall of the organic photoelectric conversion film and the second electrode.

(2)

The solid-state imaging device according to (1), in which a plurality of the first electrodes are provided on the substrate, and the organic photoelectric conversion film is continuously formed as a layer common to the plurality of first electrodes.

(3)

The solid-state imaging device according to (1) or (2), in which the second electrode includes a second inclined surface on a side wall thereof.

(4)

The solid-state imaging device according to (3), in which the second inclined surface has an inclination angle equal to or lower than an inclination angle of the first inclined surface.

(5)

The solid-state imaging device according to any one of (1) to (4), in which the first sealing film is formed in contact with the side wall of the organic photoelectric conversion film.

(6)

The solid-state imaging device according to any one of (1) to (5), further including a second sealing film between the side wall of the organic photoelectric conversion film and the first sealing film.

(7)

The solid-state imaging device according to any one of (1) to (6), in which a plurality of the first electrodes and a plurality of the organic photoelectric conversion films are formed, and a third sealing film having a refractive index lower than a refractive index of the first sealing film is further included in a region between the side walls of the organic photoelectric conversion films adjacent to each other.

(8)

The solid-state imaging device according to any one of (1) to (7), in which the second electrode is continuously formed over a region facing a top surface and a region facing the side wall of the organic photoelectric conversion film.

(9)

The solid-state imaging device according to (8), in which a plurality of the first electrodes and a plurality of the organic photoelectric conversion films are formed, and the second electrode is provided for each of the organic photoelectric conversion films.

(10)

The solid-state imaging device according to (8), in which a plurality of the first electrodes and a plurality of the organic photoelectric conversion films are formed, and the second electrode is continuously provided as a layer common to the organic photoelectric conversion films.

(11)

The solid-state imaging device according to any one of (1) to (10), in which the organic photoelectric conversion film contains one or more of quinacridone, subphthalocyanine, or derivatives thereof.

(12)

The solid-state imaging device according to any one of (1) to (11), in which the substrate includes a semiconductor layer that includes one or two or more photoelectric conversion devices.

(13)

A method of manufacturing a solid-state imaging device, the method including:

a process of forming a plurality of pixels each including a first electrode, an organic photoelectric conversion film, and a second electrode in this order on a substrate, the organic photoelectric conversion film including a first inclined surface on a side wall; and a process of forming a first sealing film, on the plurality of pixels, to cover the side wall of the organic photoelectric conversion film and the second electrode.

(14)

The method of manufacturing the solid-state imaging device according to (13), in which after the organic photoelectric conversion film and the second electrode are formed in this order, the formed organic photoelectric conversion film and the formed second electrode are collectively processed to form the first inclined surface on the side wall of the organic photoelectric conversion film, and to form a second inclined surface on a side wall of the second electrode.

(15)

The method of manufacturing the solid-state imaging device according to (13) or (14), in which the first sealing film is formed with use of an Atomic Layer Deposition (ALD) method, a Chemical Vapor Deposition (CVD) method, or a Physical Vapor Deposition (PVD) method.

(16)

A solid-state imaging device, including:

a plurality of pixels each including a first electrode, an organic photoelectric conversion film, and a second electrode in this order on a substrate;

a first sealing film formed, on the plurality of pixels, to cover a side wall of the organic photoelectric conversion film and the second electrode; and a second sealing film formed between the side wall of the organic photoelectric conversion film and the first sealing film.

(17)

The solid-state imaging device according to (16), in which the second sealing film is formed in contact with the side wall of the organic photoelectric conversion film and a side wall of the second electrode.

(18)

A solid-state imaging device, including:

a plurality of pixels each including a first electrode, an organic photoelectric conversion film, and a second electrode in this order on a substrate; and a first sealing film formed on the plurality of pixels, in which a plurality of the organic photoelectric conversion films are disposed separately for the respective pixels, and a third sealing film is formed to fill a region between side walls of the organic photoelectric conversion films adjacent to each other.

(19)

The solid-state imaging device according to (18), in which the third sealing film has a refractive index lower than a refractive index of the first sealing film.

(20)

The solid-state imaging device according to (19), in which the third sealing film contains one or more of aluminum oxide ($AlO_x$), carbon-containing silicon oxide (SiOC), tungsten (W), and aluminum (Al).

(21)

An electronic apparatus provided with a solid-state imaging device, the solid-state imaging device including:

a plurality of pixels each including a first electrode, an organic photoelectric conversion film, and a second electrode in this order on a substrate, the organic photoelectric conversion film including a first inclined surface on a side wall; and a first sealing film formed, on the plurality of pixels, to cover the side wall of the organic photoelectric conversion film and the second electrode.

This application claims the benefit of Japanese Priority Patent Application JP2015-198578 filed on Oct. 6, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging device, comprising:
a substrate;
a plurality of pixels, wherein
each of the plurality of pixels includes a respective first electrode of a plurality of first electrodes, an organic photoelectric conversion film, and a second electrode in an order on the substrate,
the second electrode includes a first side wall that has a first inclined surface having an inclination angle with respect to the substrate,
the organic photoelectric conversion film includes a second side wall that has a second inclined surface having an inclination angle with respect to the substrate,
the inclination angle of the first inclined surface and the inclination angle of the second inclined surface are less than 90 degrees, and
the inclination angle of the second inclined surface is equal to or lower than the inclination angle of the first inclined surface; and
a first sealing film, on the plurality of pixels, to cover the second side wall of the organic photoelectric conversion film and the second electrode,
wherein the plurality of first electrodes are separated, the organic photoelectric conversion film is a continuous layer common to the plurality of first electrodes and the second electrode is a continuous common layer on the organic photoelectric conversion film.

2. The solid-state imaging device according to claim 1, wherein the plurality of first electrodes are on the substrate.

3. The solid-state imaging device according to claim 1, wherein the first sealing film is in contact with the second side wall of the organic photoelectric conversion film.

4. The solid-state imaging device according to claim 1, wherein the organic photoelectric conversion film comprises at least one of quinacridone, subphthalocyanine, derivatives of quinacridone, or derivatives of subphthalocyanine.

5. The solid-state imaging device according to claim 1, wherein the substrate includes a semiconductor layer that includes at least one photoelectric conversion device.

* * * * *